(12) United States Patent
Yang et al.

(10) Patent No.: US 9,730,331 B2
(45) Date of Patent: Aug. 8, 2017

(54) DISPLAY PANEL MOTHERBOARD AND MANUFACTURING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Guang Yang, Beijing (CN); Peng Shen, Beijing (CN); Yanming Wang, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 221 days.

(21) Appl. No.: 14/427,947

(22) PCT Filed: Jun. 18, 2014

(86) PCT No.: PCT/CN2014/080235
§ 371 (c)(1),
(2) Date: Mar. 12, 2015

(87) PCT Pub. No.: WO2015/109738
PCT Pub. Date: Jul. 30, 2015

(65) Prior Publication Data
US 2015/0313021 A1    Oct. 29, 2015

(30) Foreign Application Priority Data

Jan. 21, 2014    (CN) .......................... 2014 1 0026858

(51) Int. Cl.
*H05K 3/00*      (2006.01)
*H01L 27/12*     (2006.01)
(Continued)

(52) U.S. Cl.
CPC ......... *H05K 3/0017* (2013.01); *H01L 27/124* (2013.01); *H01L 27/1214* (2013.01);
(Continued)

(58) Field of Classification Search
None
See application file for complete search history.

(56) References Cited

U.S. PATENT DOCUMENTS

| 7,518,683 B2 | 4/2009 | Inoue et al. | |
| 2007/0293019 A1* | 12/2007 | Jeng | B28D 5/022 438/460 |
| 2010/0197114 A1 | 8/2010 | Jeng et al. | |

FOREIGN PATENT DOCUMENTS

| CN | 1627156 A | 6/2005 |
| CN | 101150091 A | 3/2008 |

(Continued)

OTHER PUBLICATIONS

Second Chinese Office Action in Chinese Application No. 201410026858.5, mailed May 17, 2016 with English translation.
(Continued)

*Primary Examiner* — Jiong-Ping Lu
(74) *Attorney, Agent, or Firm* — Collard & Roe, P.C.

(57) ABSTRACT

A display panel motherboard and a manufacturing method thereof are provided. The display panel motherboard comprises display panel regions (Q1) spaced apart from each other and precut regions (Q2) adjacent to the display panel regions. The manufacturing method comprises forming an electrical insulating layer (102); and removing at least portions of the electrical insulating layer provided on the precut regions (Q2). The method avoids the problem of other patterns offset on the display panel motherboard caused by the larger internal stress within the electrical insulating layer.

16 Claims, 2 Drawing Sheets

108

(51) Int. Cl.
  *H05K 1/02*       (2006.01)
  *H05K 3/46*       (2006.01)
(52) U.S. Cl.
  CPC ...... *H01L 27/1218* (2013.01); *H01L 27/1248* (2013.01); *H01L 27/1288* (2013.01); *H05K 1/0296* (2013.01); *H05K 3/0073* (2013.01); *H05K 3/46* (2013.01)

(56) References Cited

FOREIGN PATENT DOCUMENTS

| CN | 101826488 A | 9/2010 |
| CN | 103779356 A | 5/2014 |

OTHER PUBLICATIONS

International Search Report with Notice of Transmittal of the International Search Report of PCT/CN2014/080235 in Chinese, mailed Oct. 22, 2014.
Written Opinion of the International Searching Authority of PCT/CN2014/080235 in Chinese with English translation mailed Oct. 22, 2014.
Chinese Office Action of Chinese Application No. 201410026858.5, mailed Oct. 20, 2015 with English translation.

\* cited by examiner

DISPLAY PANEL MOTHERBOARD AND MANUFACTURING METHOD THEREOF

CROSS REFERENCE TO RELATED APPLICATIONS

This application is the National Stage of PCT/CN2014/080235 filed on Jun. 18, 2014, which claims priority under 35 U.S.C. §119 of Chinese Application No. 201410026858.5 filed on Jan. 21, 2014, the disclosure of which is incorporated by reference.

TECHNICAL FIELD

Embodiments of the present invention relate to a display panel motherboard and a manufacturing method thereof.

BACKGROUND

In the field of display technology, the display device is widely applied in the modem digital information apparatus due to its small volume, low power consumption, non-radiation and high resolution.

Generally, the display device comprises a display panel, wherein the display panel is formed by assembling two piece of display panel motherboards (such as an array substrate motherboard and a color film substrate motherboard), then cutting the assembled motherboards. The display panel motherboard is provided with cutting lines thereon, wherein the cutting lines is positioned on pre-cutting regions of the display panel motherboard. The display panel motherboard is divided into a plurality of display panels by the cutting lines, wherein the display panels are positioned on display panel regions of the display panel motherboard. After the display panel motherboard is cut according to the cutting lines, one display panel region corresponds to one display panel.

Generally, steps for forming the display panel motherboard comprise: forming a large area of films on a glass substrate, and making exposure and large area of etching, then forming structures of each layer of the display panel motherboard. Except for most portions of electrical insulating layers, other film layers are generally etched to form patterns (such as a gate line, a data line, a transparent electrode), and since the depositions of each electrical insulating layer (such as a gate insulating layer, a passivation layer) create different stress, resulting in the shrinking or expanding of the glass substrate.

For example, the passivation layer and the gate insulating layer are formed in large area film, and a few of via holes are formed finally. Therefore, after etching, the stress cannot be sufficiently released. After the passivation layer and the gate insulating layer are formed, the glass substrate is affected by the internal stress of large areas of electrical insulating layer, such as the passivation layer and the gate insulating layer), the intention of shrinking and expanding is not stable, which significantly affect subsequent procedures, especially, it may cause patterns of the film layers formed on the electrical insulating layers to offset.

SUMMARY

The embodiments of the present invention provide a display panel motherboard, which can improve the pattern offset, and manufacturing method thereof.

At least one embodiment of the present invention provides a method of manufacturing a display panel motherboard, wherein the display panel motherboard comprises display panel regions spaced apart from each other and precut regions adjacent to the display panel regions, and the method comprising: forming an electrical insulating layer; and removing at least portions of the electrical insulating layer provided on the precut regions.

In an example, the portions of the electrical insulating layer of the precut regions are removed by a patterning process.

In an example, all of the portions of the electrical insulating layer on the precut regions are removed.

In an example, the method further comprises, using a mask provided with saw-tooth shape on edges to pattern the portions of the electrical insulating layer of the precut regions in a patterning process, wherein the remained portions of the electrical insulating layer of the precut regions form a slope angle.

At least one embodiment of the present invention provides a display panel motherboard, the display panel motherboard comprises display panel regions spaced apart from each other and precut regions adjacent to the display panel regions, wherein at least portions of the electrical insulating layer provided on the precut regions in the display panel motherboard are removed.

In an example, all of the portions of the electrical insulating layer in the precut regions are removed.

In an example, the remained portions of the electrical insulating layer have a slope angle on the edges.

In an example, the slope angle is in a range of 30-70 degree.

In an example, the electrical insulating layer comprises one or more of a passivation layer, a gate insulating layer and an etching stop layer.

BRIEF DESCRIPTION OF THE DRAWINGS

Embodiments of the present invention will be described in detail hereinafter in conjunction with accompanying drawings to allow one of ordinary skill in the art to understand the present invention more clearly, in which.

DETAILED DESCRIPTION

The technical solutions of the embodiments will be described in a clearly and fully understandable way in connection with the drawings related to embodiments of the disclosure. Apparently, the described embodiments are just a part but not all of the embodiments of the disclosure. Based on the described embodiments herein, those skilled in the art can obtain other embodiment(s), without any inventive work, which shall fall within the protection scope of the present disclosure.

Unless otherwise defined, all the technical and scientific terms used herein have the same meanings as commonly understood by one of ordinary skill in the art to which the present invention belongs. The terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

It should be understood that the pattern(s), graph(s) in the embodiments of the present invention refer to various structures formed by a patterning process; the patterning process in the present invention comprises part or all of applying photoresist, masking, exposing, developing, etching, removing photoresist and the like; and the phototresist in the examples is a positive photoresist, but the present invention is not limited thereof.

A First Embodiment

Figure 1:
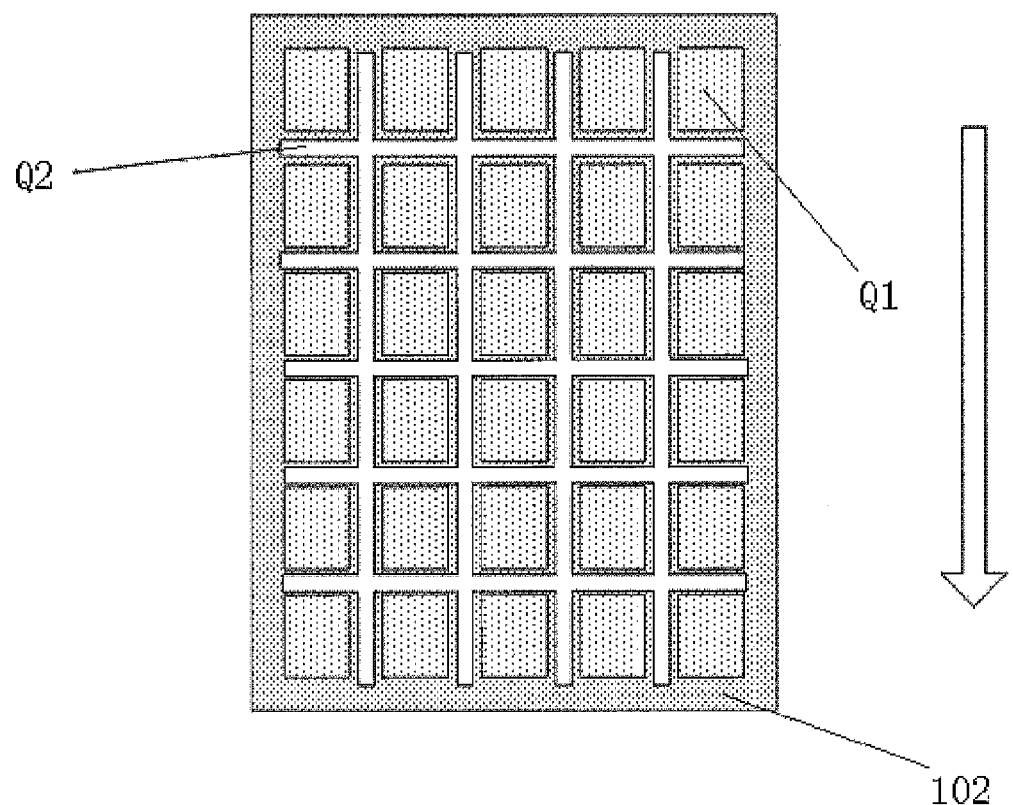
FIG. 1 is a schematic view of a display substrate motherboard according to a first embodiment.

As shown in FIG. 1, the embodiment provides a display panel motherboard, the display panel motherboard comprises display panel regions Q1 spaced apart from each other and precut regions Q2 adjacent to the display panel regions Q1. The display panel regions Q1 correspond to positions on which the display panels are located, and the precut regions Q2 correspond to positions on which the cut lines are located. In the display panel motherboard, at least portions of an electrical insulating layer 102 disposed on the precut regions Q2 are removed.

Since at least portions of the electrical insulating layer 102 disposed on the precut regions Q2 of the display panel motherboard are removed in the embodiment of the present invention, the internal stress in the electrical insulating layer 102 is released well, and it can better avoid the larger stress within the electrical insulating layer 102 affecting other film layers over or below the electrical insulating layer 102, and thereby to improve the occurrence of offset of other patterns on the display panel motherboard caused by the larger stress within the electrical insulating layer 102.

For releasing the internal stress of the electrical insulating layer 102 as much as possible, for example, all portions of the electrical insulating layer 102 on the precut regions Q2 are removed.

It should be noted that it is required to avoid other film layers deposited on the electrical insulating layer 102 being affected while the internal stress of the electrical insulating layer 102 is released as much as possible, especially, it should be noted to avoid segment difference produced by removing the electrical insulating layer 102 of the precut regions Q2 affecting subsequent processes. For example, when rubbing aligning after the alignment film is formed, it would create a fluctuation when rubbing due to the segment difference, thereby affecting correspondingly the alignment (the direction of the rubbing alignment is shown as the arrow in FIG. 1). For avoiding this affection, a certain slope angle is retained on edges of the remained portions of the electrical insulating layer 102 so that the removed portions of the electrical insulating layer 102 on the precut regions Q2 has a gentler slope, thereby to reduce fluctuation caused in the membrane material alignment. However, the slope angle of a via hole is remained on the electrical insulating layer 102 of the display panel region Q1 so that the affection caused by removing the portions of the electrical insulating layer 102 of the precut regions Q2 is relieved. The slope angle is preferably between 30-70 degree, which can be selected as required.

The electrical insulating layer 102 can be one or more of a passivation layer, a gate insulating layer and an etching stop layer, for example. The passivation layer is disposed between a source-drain layer and a pixel electrode layer of a thin film transistor. The pixel electrode is connected with a drain electrode by a contact via hole through the passivation layer. The gate insulating layer is used to separate the gate layer from an active region. The source-drain electrode is connected with the active region by a contact via hole through the etching stop layer. Generally, since there is only a few of via holes on the electrical insulating layer, the internal stress cannot be sufficiently released. The internal stress can be sufficiently released by removing at least portions of the electrical insulating layer of the precut regions Q2, thereby the occurrence of pattern offset of other patterns on the display panel motherboard caused by the larger stress within each electrical insulating layer is improved. Other electrical insulating layers disposed on the precut regions Q2 of the display panel motherboard can also be removed.

In the display panel motherboard according to embodiment of the present invention, since at least portions of the electrical insulating layer are removed, the internal stress in the electrical insulating layer can be sufficiently released, thereby it can better avoid the larger stress within the electrical insulating layer affecting other film, layers over or below the electrical insulating layer, and thereby to improve the occurrence of pattern offset of other patterns on the display panel motherboard caused by the larger stress within the electrical insulating layer.

A Second Embodiment

Figure 2A:
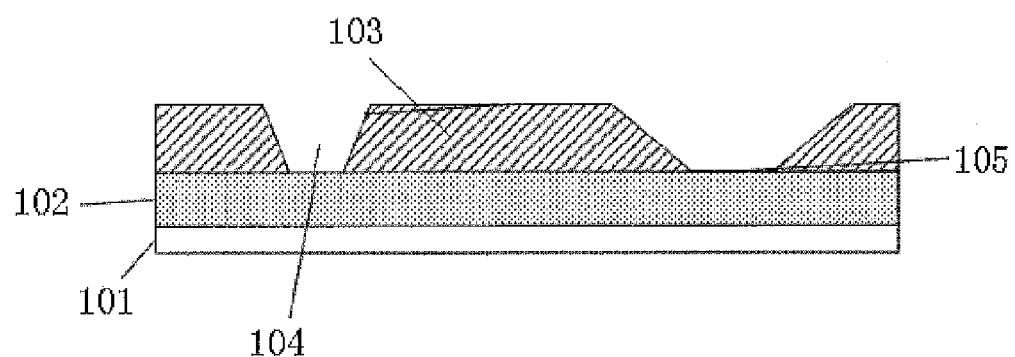
FIGS. 2a and 2b are flow charts of the method of manufacturing the display substrate motherboard according to a second embodiment.
Figure 2B:
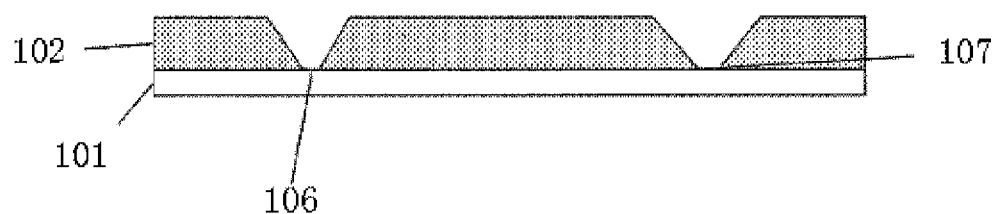

As shown in FIGS. 2a and 2b, the embodiment provides a method of manufacturing a display panel motherboard, wherein the display panel motherboard comprises display panel regions spaced apart from each other and precut regions adjacent to the display panel regions, and the method comprises the following step.

A layer of electrical insulating film 102 is formed on a substrate 101; a photoresist 103 is applied on the electrical insulating layer film 102, and the photoresist is exposed and developed. The photoresist corresponding to a contact via hole region 104 and the photoresist corresponding to the region 105 on which the electrical insulating layer of the precut region 105 to be removed are removed, as shown in FIG. 2a.

The steps of forming contact via holes can be performed simultaneously with the above steps, or performed separately. For example, when the method comprises a plurality of electrical insulating layers 102, contact via holes of each layer are formed separately, and the portions of the electrical insulating layer 102 of the precut regions are removed together.

On the substrate 101 undergone the above steps, a pattern comprising the electrical insulating layer 102 is formed on the substrate by a patterning process, and at least portions of the electrical insulating layer 102 disposed on the precut region are removed. The removed regions of the electrical insulating layer are shown as 107 in FIG. 2b. A corresponding contact via hole 106 is formed on the electrical insulating layer 102, as shown in FIG. 2b.

Since at least portions of the electrical insulating layer 102 disposed on the precut regions of the display panel motherboard are removed in the embodiment of the present invention, the internal stress in the electrical insulating layer 102 is released sufficiently, and it can better avoid the larger stress within the electrical insulating layer 102 affecting other film layers over or below the electrical insulating layer 102, and thereby to improve the occurrence of pattern offset of other patterns on the display panel motherboard caused by the larger stress within the electrical insulating layer 102.

For releasing the internal stress of the electrical insulating layer 102 as much as possible, for example, all of the portions of the electrical insulating layer 102 on the precut regions are removed.

Figure 3:
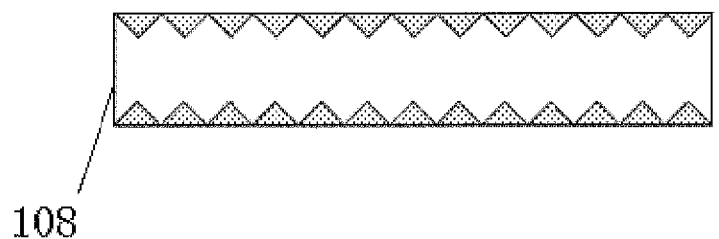
FIG. 3 is a part schematic structural view of the saw-tooth mask used in the process of manufacturing the display substrate motherboard according to the second embodiment.

According to an embodiment, for example, as shown in FIG. 3, a pattern comprising an electrical insulating layer 102 is formed on the substrate by a patterning process, using a mask 108 provided with saw-toothed shape at edges. Since such a mask is used, a certain slope angle is retained on edges of the electrical insulating layer 102, thereby to avoid segment difference produced by removing the portions of the electrical insulating layer 102 of the precut regions affecting subsequent processes. A layer of photoresist is formed on the substrate formed with the electrical insulating layer, and a saw-toothed mask is selected to perform an exposure process. Since the light produces diffraction on tips of the saw-toothed mask, a slope angle can be formed on the phtotoresist; and then etching (dry etching) is performed so that the electrical insulating layer below the photoresist would copy the slope angle of the photoresist, thereby a gentle slope angle is formed on edges of the electrical insulating layer 102 of the precut regions Q2. In this way, not only the affection to the subsequent rubbing alignment process can be reduced, but also the stress of the passivation layer can be effectively released. It should be noted that positions of the saw-toothed mask corresponding to the electrical insulating layer 102 of the precut regions can be changed, and the mask pattern of other regions can be configured according to requirements so as to form other patterns on the display substrate; that is, the saw-toothed mask is not contradicted with the pattern formation of other regions, and its position is not limited.

It should be noted that other film layers and other structures of the display panel motherboard according to the embodiments are manufactured with conventional methods, which are not repeated in detail herein.

It is understood that the described above are only illustrative embodiments and implementations for explaining the principle of the present invention, and the present invention is not intended to limited thereto. For one of ordinary skill in the art, various modifications and improvements can be made without departing from the spirit and scope of the present invention, and all of which should fall within the protection scope of the present invention.

The present invention claims priority of Chinese patent application No. 201410026858.5 filed on Jan. 21, 2014 titled "display panel motherboard and manufacturing method thereof", the entire contents of which are incorporated herein by reference.

What is claimed is:

1. A method of manufacturing a display panel motherboard, wherein the display panel motherboard comprises display panel regions spaced apart from each other and precut regions adjacent to the display panel regions, and the method comprising:
   forming an electrical insulating layer;
   removing at least portions of the electrical insulating layer provided on the precut regions; and
   using a mask provided with saw-tooth shape on edges to pattern the portions of the electrical insulating layer of the precut regions in a patterning process, wherein the remained portions of the electrical insulating layer of the precut regions form a slope angle.

2. The method of manufacturing the display panel motherboard according to claim 1, wherein the portions of the electrical insulating layer of the precut regions are removed by a patterning process.

3. The method of manufacturing the display panel motherboard according to claim 2, wherein the electrical insulating layer comprises one or more of a passivation layer, a gate insulating layer and an etching stop layer.

4. The method of manufacturing the display panel motherboard according to claim 1, wherein all portions of the electrical insulating layer of the precut regions are removed.

5. The method of manufacturing the display panel motherboard according to claim 4, wherein the electrical insulating layer comprises one or more of a passivation layer, a gate insulating layer and an etching stop layer.

6. The method of manufacturing the display panel motherboard according to claim 1, wherein the slope angle is in a range of 30-70 degree.

7. The method of manufacturing the display panel motherboard according to claim 1, wherein the electrical insulating layer comprises one or more of a passivation layer, a gate insulating layer and an etching stop layer.

8. The method of manufacturing the display panel motherboard according to claim 2, wherein all portions of the electrical insulating layer of the precut regions are removed.

9. A display panel motherboard manufactured by the method of claim 1, comprising:
   display panel regions spaced apart from each other; and
   precut regions adjacent to the display panel regions;
   wherein at least portions of the electrical insulating layer provided on the precut regions in the display panel motherboard are removed.

10. The display panel motherboard according to claim 9, wherein all portions of the electrical insulating layer of the precut regions are removed.

11. The display panel motherboard according to claim 10, wherein the remained portions of the electrical insulating layer has a slope angle on the edges.

12. The display panel motherboard according to claim 11, wherein the slope angle is in a range of 30-70 degree.

13. The display panel motherboard according to claim 12, wherein the electrical insulating layer comprises one or more of a passivation layer, a gate insulating layer and an etching stop layer.

14. The display panel motherboard according to claim 9, wherein the remained portions of the electrical insulating layer has a slope angle on the edges.

15. The display panel motherboard according to claim 10, wherein the slope angle is in a range of 30-70 degree.

16. The display panel motherboard according to claim 9, wherein the electrical insulating layer comprises one or more of a passivation layer, a gate insulating layer and an etching stop layer.

* * * * *